United States Patent
Wei et al.

(10) Patent No.: US 11,272,635 B2
(45) Date of Patent: Mar. 8, 2022

(54) FRAME AND ELECTRONIC FRAME

(71) Applicant: BOE TECHNOLOGY GROUP CO., LTD., Beijing (CN)

(72) Inventors: Jinggang Wei, Beijing (CN); Lei Cao, Beijing (CN); Ken Wen, Beijing (CN); Long Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/959,399

(22) PCT Filed: Sep. 26, 2019

(86) PCT No.: PCT/CN2019/108205
§ 371 (c)(1),
(2) Date: Jun. 30, 2020

(87) PCT Pub. No.: WO2020/093810
PCT Pub. Date: May 14, 2020

(65) Prior Publication Data
US 2020/0337172 A1    Oct. 22, 2020

(30) Foreign Application Priority Data

Nov. 6, 2018  (CN) .......................... 201821824991.5

(51) Int. Cl.
*H05K 7/14* (2006.01)
*H05K 5/00* (2006.01)
*H05K 5/02* (2006.01)

(52) U.S. Cl.
CPC ......... *H05K 7/1427* (2013.01); *H05K 5/0017* (2013.01); *H05K 5/0221* (2013.01); *H05K 5/0243* (2013.01); *H05K 7/1438* (2013.01)

(58) Field of Classification Search
CPC .. H05K 7/1427; H05K 5/0017; H05K 5/0221; H05K 5/0243; H05K 7/1438;
(Continued)

(56) References Cited

U.S. PATENT DOCUMENTS

| | | | |
|---|---|---|---|
| 7,948,572 B2 * | 5/2011 | Bae | G02F 1/133308 349/58 |
| 9,097,935 B2 * | 8/2015 | Hyung | G02F 1/133606 |
| 2007/0064378 A1 * | 3/2007 | Lo | G06F 1/1613 361/679.22 |

(Continued)

FOREIGN PATENT DOCUMENTS

| | | |
|---|---|---|
| CN | 103235436 A | 8/2013 |
| CN | 104111546 A | 10/2014 |

(Continued)

*Primary Examiner* — Hung S. Bui
*Assistant Examiner* — Sagar Shrestha
(74) *Attorney, Agent, or Firm* — McDermott Will & Emery LLP

(57) ABSTRACT

A frame includes a first frame, a back case and a second frame. The first frame includes a first frame plate and a first frame wall, the back case includes a back case plate and a back case wall, the second frame includes a second frame plate and a second frame wall, and the second frame surrounds the first frame and the back case. The second frame plate is located on a side of the first frame plate facing away from the back case plate, and the first frame wall is protruded from a surface of the first frame plate facing towards the back case plate, the back case wall is protruded from a surface of the back case plate facing towards the first frame plate, and the second frame wall is protruded from a surface of the second frame plate facing towards the first frame plate.

18 Claims, 5 Drawing Sheets

(58) Field of Classification Search
CPC ............... H05K 5/0013; G06F 1/1601; G02F 1/133308; G02F 1/133322; G02F 1/133325; G02F 2201/465; G09F 9/00
See application file for complete search history.

(56) References Cited

U.S. PATENT DOCUMENTS

| | | | | |
|---|---|---|---|---|
| 2008/0137272 | A1* | 6/2008 | Cheng | G02F 1/133308 361/679.01 |
| 2009/0002928 | A1* | 1/2009 | Murakami | G02F 1/133308 |
| 2013/0321739 | A1* | 12/2013 | Cheng | G09F 13/04 349/58 |
| 2015/0042898 | A1* | 2/2015 | Ikuta | G06F 1/1601 348/790 |
| 2015/0160405 | A1* | 6/2015 | Park | G02B 6/0081 362/606 |
| 2015/0181656 | A1* | 6/2015 | Bang | G02F 1/133308 313/512 |
| 2015/0293292 | A1* | 10/2015 | Lee | G02B 6/0026 362/608 |
| 2015/0370118 | A1 | 12/2015 | Zhou | |
| 2016/0054615 | A1* | 2/2016 | Kim | G02B 6/0081 362/611 |
| 2016/0209697 | A1* | 7/2016 | Chang | G02B 6/4261 |
| 2016/0306104 | A1 | 10/2016 | Hsieh et al. | |
| 2016/0377908 | A1* | 12/2016 | Shin | G02F 1/133308 349/58 |
| 2017/0168345 | A1* | 6/2017 | Wu | G02F 1/133308 |
| 2017/0200421 | A1* | 7/2017 | Baek | G09G 3/3406 |
| 2019/0094602 | A1* | 3/2019 | Jung | G02B 6/0068 |
| 2019/0154908 | A1* | 5/2019 | Yabuuchi | G02F 1/133308 |
| 2020/0337172 | A1 | 10/2020 | Wei et al. | |

FOREIGN PATENT DOCUMENTS

| | | |
|---|---|---|
| CN | 203909428 U | 10/2014 |
| CN | 106151972 A | 11/2016 |
| CN | 208889233 U | 5/2019 |

* cited by examiner

FRAME AND ELECTRONIC FRAME

CROSS-REFERENCE TO RELATED APPLICATION

This application is a Section 371 National Stage Application of International Application No. PCT/CN2019/108205, filed on Sep. 26, 2019, which claims priority to Chinese Patent Application No. 201821824991.5, filed on Nov. 6, 2018, the disclosures of which are incorporated herein by reference in their entirety.

TECHNICAL FIELD

Embodiments of the present disclosure relate to a frame and an electronic frame.

BACKGROUND

An electronic frame includes: a frame, and a display panel assembled in the frame.

SUMMARY

Embodiments of the present disclosure provide a frame including:

a first frame, a back case and a second frame, wherein the first frame includes: a first frame plate and a first frame wall, wherein the back case includes: a back case plate and a back case wall, wherein the second frame includes: a second frame plate and a second frame wall, and the second frame is configured to surround the first frame and the back case, wherein the first frame plate is disposed opposite to the back case plate, and the second frame plate is located on a side of the first frame plate facing away from the back case plate, wherein the first frame wall protrudes from a surface of the first frame plate facing towards the back case plate, the back case wall protrudes from a surface of the back case plate facing towards the first frame plate, and the second frame wall protrudes from a surface of the second frame plate facing towards the first frame plate.

In some embodiments of the present disclosure, the first frame wall is located between the first frame plate and the back case plate, the back case wall is located between the first frame plate and the back case plate, and the second frame wall is located on a side of the second frame plate facing towards the first frame plate.

In some embodiments of the present disclosure, one of the first frame and the back case has a first engagement protrusion, and the other of the first frame and the back case has a first engagement recess, and the first engagement protrusion is engaged in the first engagement recess.

In some embodiments of the present disclosure, one of the back case and the second frame has a second engagement protrusion, and the other of the back case and the second frame has a second engagement recess, and the second engagement protrusion is engaged in the second engagement recess.

In some embodiments of the present disclosure, the back case has a plurality of first engagement protrusions, the first frame has a plurality of first engagement recesses in one-to-one correspondence with the plurality of first engagement protrusions, and each of the plurality of first engagement protrusions is engaged in a corresponding one of the plurality of first engagement recesses.

In some embodiments of the present disclosure, the back case has a plurality of second engagement recesses, the second frame has a plurality of second engagement protrusions in one-to-one correspondence with the plurality of second engagement recesses, and each of the plurality of second engagement protrusions is engaged in a corresponding one of the plurality of second engagement recesses.

In some embodiments of the present disclosure, a first surface of the first engagement protrusion facing towards the back case plate is parallel to and in contact with a wall surface of the first engagement recess facing away from a first reference surface, and the first reference surface is a surface of the first frame plate facing away from the back case plate.

In some embodiments of the present disclosure, a second surface of the first engagement protrusion facing away from the back case plate makes an angle with a wall surface of the first engagement recess facing towards the first reference surface.

In some embodiments of the present disclosure, a third surface of the second engagement protrusion facing towards the second frame plate is parallel to and in contact with a wall surface of the second engagement recess facing away from a second reference surface, and the second reference surface is a surface of the back case plate facing away from the first frame plate.

In some embodiments of the present disclosure, a fourth surface of the second engagement protrusion facing away from the second frame plate makes an angle with a wall surface of the second engagement recess facing towards the second reference surface.

In some embodiments of the present disclosure, the back case further includes: a position limit part protruded from the surface of the back case plate facing towards the first frame plate, the position limit part includes a first position limit protrusion, and the first frame wall is located between the back case wall and the first position limit protrusion.

In some embodiments of the present disclosure, the position limit part further includes a second position limit protrusion connected with the first position limit protrusion, and the first frame wall has a position limit recess located at an edge of the first frame wall facing away from the first frame plate and matching the second position limit protrusion, and the second position limit protrusion is located in the position limit recess.

In some embodiments of the present disclosure, the back case further includes: a position limit part protruded from the surface of the back case plate facing towards the first frame plate, the position limit part includes a plurality of first position limit protrusions, and the first frame wall is located between the back case wall and the plurality of first position limit protrusions, a plurality of second position limit protrusions respectively connected with the plurality of first position limit protrusions, the first frame wall has a plurality of position limit recesses located at an edge of the first frame wall facing away from the first frame plate and matching the plurality of second position limit protrusions, and the plurality of second position limit protrusions are located in the plurality of position limit recesses, respectively; and connection structures each connecting two adjacent ones of the plurality of first position limit protrusions, and each having a recess.

In some embodiments of the present disclosure, the back case wall has a notch at an edge of the back case wall facing away from the back case plate, and the notch is adjacent to the first engagement protrusion or the first engagement recess of the back case wall to disengage the first engagement protrusion from the first engagement recess.

In some embodiments of the present disclosure, an edge of the back case wall facing away from the back case plate is in contact with the first frame plate, and/or an edge of the first frame wall facing away from the first frame plate is in contact with the back case plate.

In some embodiments of the present disclosure, the back case wall is located between the first frame wall and the second frame wall.

In some embodiments of the present disclosure, an edge of the first frame wall facing away from the first frame plate and facing towards the back case wall is chamfered or rounded, and an edge of the back case wall facing away from the back case plate is chamfered or rounded.

In some embodiments of the present disclosure, the frame further includes: a third frame including: a third frame plate and a third frame wall, wherein the third frame plate is located on a side of the first frame plate facing away from the back case plate, and the third frame wall is protruded from a surface of the third frame plate facing towards the first frame plate.

In some embodiments of the present disclosure, the third frame plate has a plurality of fixing protrusions on a surface of the third frame plate facing towards the first frame plate, the first frame plate has a plurality of fixing recesses in one-to-one correspondence with the plurality of fixing protrusions on a surface of the first frame plate facing towards the third frame plate, and each of the plurality of fixing protrusions is engaged in a corresponding one of the plurality of fixing recesses.

In some embodiments of the present disclosure, the frame further includes: a decorative layer located on a surface of the first frame plate facing away from the back case plate and configured to decorate the surface of the first frame plate facing away from the back case plate.

In some embodiments of the present disclosure, the surface of the second frame plate facing towards the first frame plate has an annular edge facing away from the second frame wall, and the second frame plate includes an annular strip-shaped protrusion protruded from the annular edge of the surface, facing towards the first frame plate, of the second frame plate towards the first frame plate.

In some embodiments of the present disclosure, the second frame plate includes a plurality of bosses on the surface of the second frame plate facing towards the first frame plate and between the second frame wall and the annular strip-shaped protrusion, the plurality of bosses are arranged at intervals along the second frame plate around the second frame wall, the annular strip-shaped protrusion has a plane facing towards the first frame plate, each of the plurality of bosses has a plane facing towards the first frame plate, and the plane of the annular strip-shaped protrusion is coplanar with the planes of the plurality of bosses.

In some embodiments of the present disclosure, the back case has a plurality of second engagement recesses, the second frame has a plurality of second engagement protrusions in one-to-one correspondence with the plurality of second engagement recesses, and each of the plurality of second engagement protrusions is engaged in a corresponding one of the plurality of second engagement recesses, and an orthogonal projection of each of the plurality of second engagement protrusions on the surface of the first frame plate partially overlaps an orthogonal projection of a corresponding one of the plurality of bosses on the surface of the first frame plate.

Embodiments of the present disclosure provide an electronic frame including: a frame, and a display panel, wherein the frame is the above frame, and the display panel is located between the first frame plate and the back case plate of the frame.

In some embodiments of the present disclosure, the display panel has a rectangular shape, each of the first frame and the second frame has a rectangular ring shape, and the back case has a rectangular shape.

BRIEF DESCRIPTION OF THE DRAWINGS

In order to describe technical solutions in embodiments of the present disclosure more clearly, accompanying drawings required for describing the embodiments will be simply explained as below. Apparently, the accompanying drawings for the following description are only some embodiments of the present disclosure. Those skilled in the art could also derive other accompanying drawings from these accompanying drawings without making a creative work.

DETAILED DESCRIPTION

In order that the object, technical solutions and advantages of embodiments of the present disclosure are more apparent, a detailed description of embodiments of the present disclosure will be further made as below in conjunction with the accompanying drawings.

With the increasing use of electronic frames in home decoration, the requirements for the convenience of disassembly and assembly of the electronic frames are also increasing. The embodiments of the present disclosure provide a frame that can be used in an electronic frame and is easy to disassemble and assemble, and thus can improve the convenience of maintenance of the electronic frame.

Figure 1:
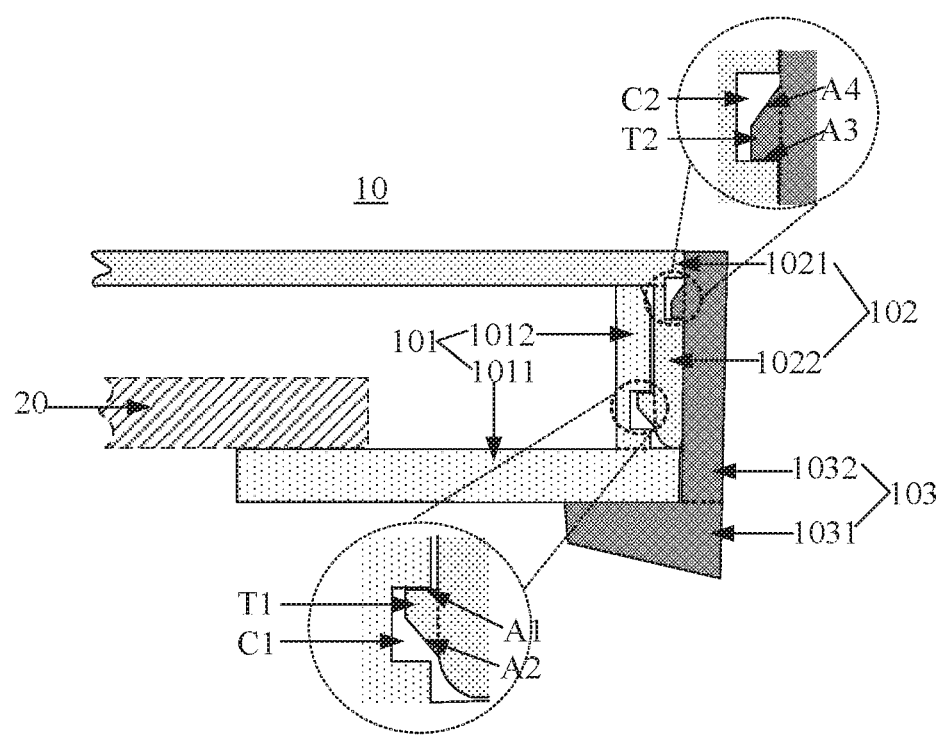
FIG. 1 is a schematic view showing a structure of a frame according to embodiments of the present disclosure.
Figure 2:
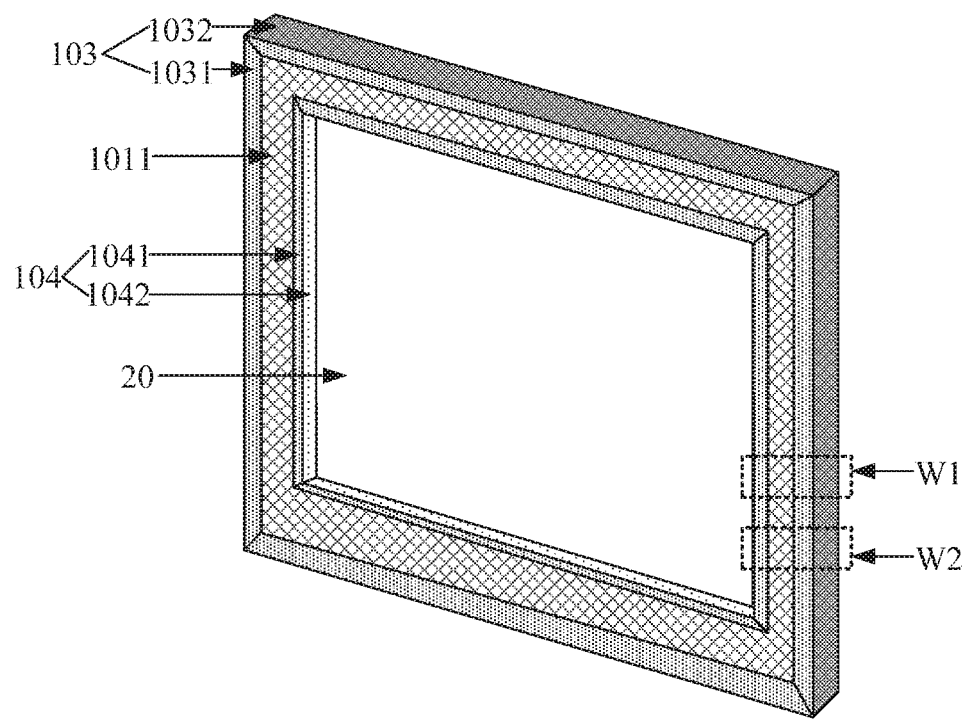
FIG. 2 is a schematic perspective view showing a structure of a frame according to embodiments of the present disclosure.

FIG. 1 is a schematic view showing a structure of a frame provided by embodiments of the present disclosure and FIG. 2 is a schematic perspective view showing a structure of a frame provided by embodiments of the present disclosure. FIG. 1 may be a sectional view of a portion of FIG. 2. As shown in FIG. 1, the frame 10 may include a first frame 101, a back case 102 and a second frame 103. The first frame 101 includes a first frame plate 1011 and a first frame wall 1012, the back case 102 includes a back case plate 1021 and a back case wall 1022, and the second frame 103 includes a second frame plate 1031 and a second frame wall 1032 and the second frame 103 are configured to surround the first frame 101 and the back case 102.

In some embodiments of the present disclosure, the first frame plate 1011 is disposed opposite to the back case plate 1021, the second frame plate 1031 is located on a side of the first frame plate 1011 facing away from the back case plate 1021, the first frame wall 1012 protrudes from a surface of the first frame plate 1011 facing towards the back case plate 1021, the back case wall 1022 protrudes from a surface of the back case plate 1021 facing towards the first frame plate 1011, and the second frame wall 1032 protrudes from a surface of the second frame plate 1031 facing towards the first frame plate 1011.

Figure 3:
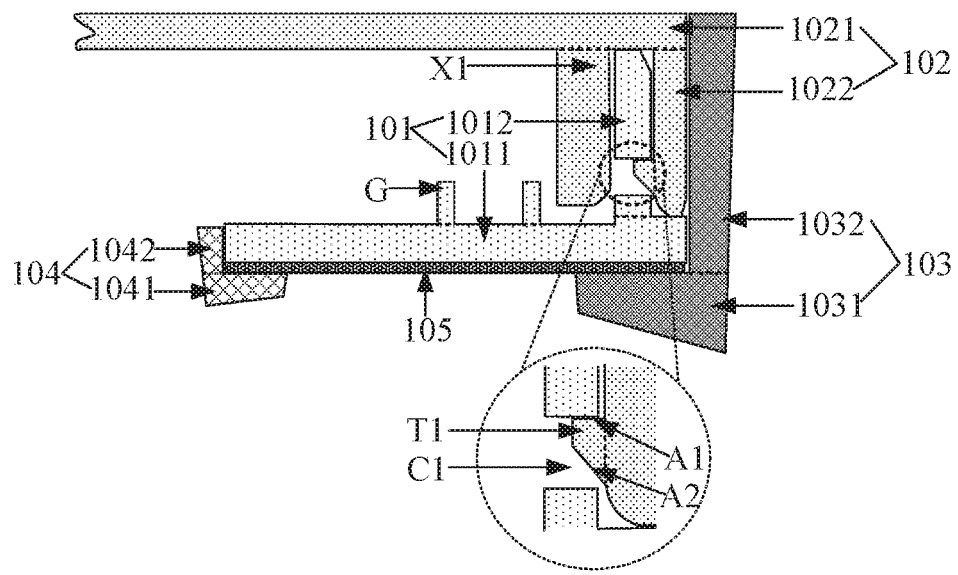
FIG. 3 is a schematic view showing a structure of a frame according to another embodiment of the present disclosure.
Figure 4:
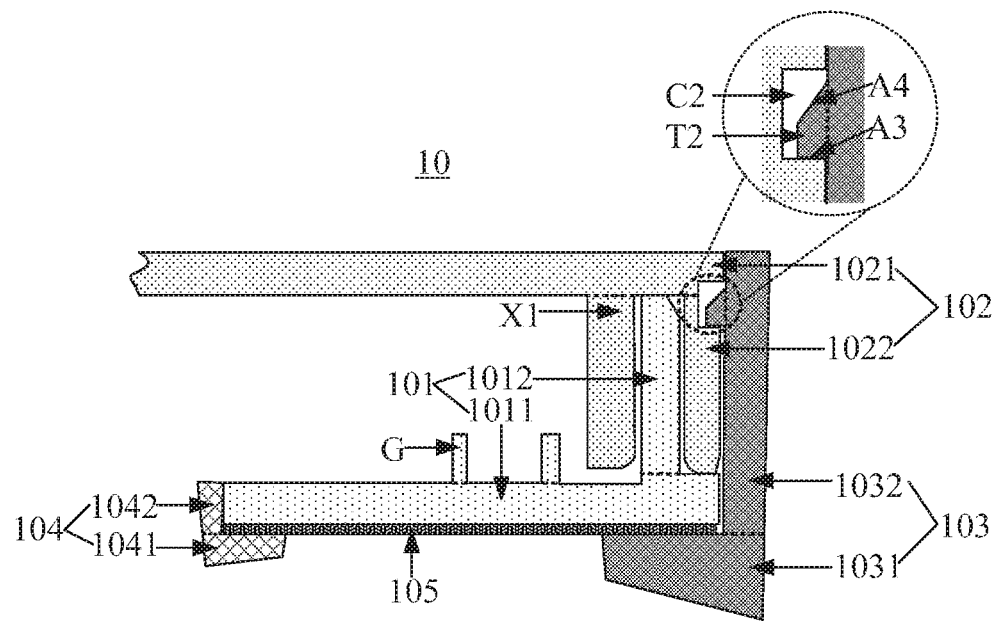
FIG. 4 is a schematic view showing a structure of a frame according to still another embodiment of the present disclosure.

In some embodiments of the present disclosure, referring to FIGS. 1, 3 and 4, the first frame wall 1012 is located between the first frame plate 1011 and the back case plate 1021, the back case wall 1022 is located between the first frame plate 1011 and the back case plate 1021, and the second frame wall 1032 is located on a side of the second frame plate 1031 facing towards the first frame plate 1011.

In some embodiments of the present disclosure, referring to FIGS. 1 and 2, each of the first frame plate 1011, the first frame wall 1012, the back case wall 1022, the second frame plate 1031, and the second frame wall 1032 may have a ring shape. It should be noted that the back case 102 and the first frame wall 1012 are not illustrated in FIG. 2. In this case, the first frame wall 1012 may be located in an outer edge region of an annulus surface of the first frame plate 1011, the second frame wall 1032 may be located in an outer edge region of an annulus surface of the second frame plate 1031, and the back case wall 1022 may be located in an edge region of the back case plate 1021. In some examples of the present disclosure, an outer surface of the first frame wall 1012 may not be flush with an outer surface of the first frame plate 1011. In some embodiments of the present disclosure, the first frame wall 1012 and the back case wall 1022 may be nested one inside the other, and the first frame wall 1012, the back case wall 1022, and the second frame plate 1031 may each surround a region surrounded by the first frame plate 1011, and the second frame wall 1032 may surround the first frame plate 1011, the first frame wall 1012, the back case plate 1021, and the back case wall 1022.

In some examples of the present disclosure, each of the first frame plate 1011, the first frame wall 1012, the back case wall 1022, the second frame plate 1031, and the second frame wall 1032 may also be composed of a plurality of independent components, and the plurality of components may be configured in the form of a ring, which is not limited in the embodiments of the present disclosure.

In some examples of the present disclosure, at least two of the first frame 101, the back case 102, and the second frame 103 may be engaged with each other, for example, the engagement may be achieved by means of an engagement protrusion and an engagement recess (this way is taken as an example in FIG. 1). In some examples of the present disclosure, the engagement may also be performed by other ways, for example, by means of cooperation between an engagement protrusion and an engagement protrusion, which is not limited in the embodiments of the present disclosure.

FIG. 1 illustrates an example in which the first frame 101, the back case 102 and the second frame 103 are engaged with one another, and shows a case where the back case wall 1022 is located between the first frame wall 1012 and the second frame wall 1032, that is, the back case wall 1022 surrounds the first frame wall 1012, and both the first frame 101 and the second frame 103 are engaged with the back case 102. In some examples of the present disclosure, the first frame 101, the back case 102, and the second frame 103 may be engaged in a relationship different from that shown in FIG. 1. For example, there may also be an embodiment where the first frame wall is located between the back case wall and the second frame wall, that is, the first frame wall may surround the back case wall, and both the back case and the second frame may be engaged with the first frame, which is not limited in the embodiments of the present disclosure.

In some examples of the present disclosure, only two of the first frame 101, the back case 102, and the second frame 103 may also be engaged, and the remaining one may be connected to the engaged two of the first frame 101, the back case 102, and the second frame 103 by other means (such as bonding or screw connection). For example, the first frame 101 may be engaged with the back case 102, and the second frame 103 may be connected to the back case 102 by other means; or the second frame 103 may be engaged with the back case 102, and the first frame 101 may be connected to the back case 102 in other ways, which is not limited in the embodiments of the present disclosure.

According to the embodiments of the present disclosure, the first frame 101, the back case 102, and the second frame 103 are fixed by engaging them with one another instead of usage of screws for fixation such that no fixation structure such as a screw is exposed on outer surface of the frame and thus the frame is simpler and more beautiful. Further, the engaged fixation can allow the frame to be easier to be assembled and disassembled. In addition, the second frame wall 1032 surrounds the first frame plate 1011, the first frame wall 1012, the back case plate 1021, and the back case wall 1022, so that the second frame 103 can protect the first frame 101 and the back case 102 and can also play a decorative role for the frame to improve the aesthetics of the frame.

A space between the first frame 101 and the back case 102 may be used to accommodate a display panel 20, and the first frame 101 and the back case 102 can fix a position of the display panel 20 and protect the display panel 20. In some embodiments of the present disclosure, the display panel may include a display screen, a device or line connected to the display screen, and other devices (such as light sensors and audio devices) used in conjunction with the display screen. The display screen may be any structure with a display function such as a liquid crystal display screen, an organic light-emitting diode display screen, or electronic paper.

In some examples of the present disclosure, material for manufacturing the frame can have a good flexibility. In some embodiments of the present disclosure, the material for manufacturing the frame may be plastic, such as acrylonitrile butadiene styrene (ABS, for abbreviation), or may be a mixture of the ABS plastic and polymeric methyl methacrylate (PMMA, for abbreviation), or a mixture of polycarbonate (PC, for abbreviation) and PMMA, etc.

In summary, at least two of the first frame, the back case, and the second frame in the frame provided by the embodiments of the present disclosure are engaged with each other, so that part or all of the frame may be assembled or disassembly without a tool, and thus the assembly or disassembly process of the frame is relatively simple.

Hereinafter, description and explanation will be made only by taking a case where the first frame wall 1012 is surrounded by the back case wall 1022, and a case where both the first frame 101 and the second frame 103 are engaged with the back case 102 as examples.

In some examples of the present disclosure, one of the first frame 101 and the back case 102 may have a first engagement protrusion, the other may have a first engagement recess, and the first engagement protrusion is engaged in the first engagement recess, in order to realize the engagement between the first frame 101 and the back case 102. One of the second frame 103 and the back case 102 may have a second engagement protrusion, and the other may have a second engagement recess, and the second engagement protrusion is engaged in the second engagement recess to realize the engagement between the second frame 103 and the back case 102.

For example, as shown in FIG. 1, the back case 102 may have a first engagement protrusion T1, the first frame 101 may have a first engagement recess C1, and the first engagement protrusion T1 is engaged in the first engagement recess C1; the back case 102 may have a second engagement recess C2, the second frame 103 may have a second engagement protrusion T2, and the second engagement protrusion T2 is engaged in the second engagement recess C2.

The number of each of the first engagement protrusion T1, the first engagement recess C1, the second engagement protrusion T2 and the second engagement recess C2 may be more than one. The plurality of first engagement protrusions T1 are in one-to-one correspondence with the plurality of first engagement recesses C1, and each first engagement protrusion T1 is engaged in one corresponding first engagement recess C1; the plurality of second engagement protrusions T2 are in one-to-one correspondence with the plurality of second engagement recesses C2, and each second engagement protrusion T2 is engaged in one corresponding second engagement recess C2. The plurality of first engagement protrusions the plurality of first engagement recesses C1, the plurality of second engagement protrusions T2, or the plurality of second engagement recesses C2 can be evenly distributed on a surface on which they are located.

In other examples of the present disclosure, the first engagement protrusion T1 is located on the first frame 101, the first engagement recess C1 is located on the back case 102, the second engagement protrusion T2 is located on the back case 102, and the second engagement recess C2 is located on the second frame 103, which are not limited in the embodiments of the present disclosure.

In the situation shown in FIG. 1, an orthographic projection of the first engagement protrusion T1 on the back case plate 1021 may be opposite to an orthographic projection of the second engagement recess C2 on the back case plate 1021. That is, if the back case 102 is divided into a plurality of parts according to the length of the first engagement protrusion T1 or the second engagement recess C2, the part where the first engagement protrusion T1 is located may further have the second engagement recess C2.

In other examples of the present disclosure, the orthographic projection of the first engagement protrusion T1 on the back case plate 1021 is offset from the orthographic projection of the second engagement recess C2 on the back case plate 1021. FIG. 3 shows the case, which is a sectional view of the first engagement protrusion T1 and one corresponding first engagement recess C1 (such as a portion W1 in FIG. 2) in the frame; FIG. 4 shows the case, which is a sectional view of the second engagement protrusion T2 and one corresponding second engagement recess C2 (such as a portion W2 in FIG. 2) in the frame. Compared with the situation shown in FIG. 1, in this case, the strength of the back case wall 1022 can be better.

In some examples of the present disclosure, the first engagement recess C1 and the second engagement recess C2 may be through holes penetrating through the first frame wall 1012 and the back case wall 1022, respectively, or may be recesses, which do not penetrate through the first frame wall 1012 and the back case wall 1022, respectively. If the engagement recesses are the through hole respectively penetrating through the first frame wall 1012 and the back case wall 1022, there is increased space for adjustment of each engagement protrusion in the engagement recess, thereby avoiding a situation where the engagement protrusion cannot be completely engaged into the corresponding engagement recess due to a relatively great manufacturing error of the engagement protrusion; if the engagement recesses are the recesses that do not penetrate through the first frame wall 1012 and the back case wall 1022, respectively, the strength of the first frame wall 1012 and the back case wall 1022 having the engagement recesses can be increased. In the embodiments of the present disclosure, FIG. 1 illustrates an example in which the first engagement recess C1 and the second engagement recess C2 are both recesses that do not penetrate through the first frame wall 1012 and the back case wall 1022, and FIGS. 3 and 4 illustrate examples in which the first engagement recess C1 is a through hole penetrating the first frame wall 1012, and the second engagement recess C2 is a recess that does not penetrate the back case wall 1022.

In some examples of the present disclosure, with continued reference to FIGS. 1, 3 and 4, the first engagement protrusion T1 may have a first surface A1 facing towards the back case plate 1021 and a second surface A2 facing away from the back case plate 1021. The first surface A1 may be parallel to and in contact with a wall surface of the first engagement recess C1 facing away from a first reference surface, and the first reference surface is the surface of the first frame plate 1011 facing away from the back case plate 1021. In some examples of the present disclosure, the second surface A2 of the first engagement protrusion T1 facing away from the back case plate 1021 and the wall surface of the first engagement recess C1 facing towards the first reference surface make an angle with each other and are spaced apart from each other.

In some embodiments of the present disclosure, the first surface A1 may be perpendicular to the back case wall 1022, and the second surface A2 may extend toward the surface of the first engagement protrusion T1 facing away from the back case wall 1022 and be inclined towards the back case plate 1021. The first surface A1 may be in contact with the wall surface of the first engagement recess C1 facing away from the first reference surface. In this way, the first engagement recess C1 can prevent the first engagement protrusion T1 from moving in the direction towards the back case plate 1021, thereby limiting a relative position between the first frame 101 and the back case 102. Moreover, the first engagement protrusion T1 may have a small volume such that the first engagement recess C1 may have a space for adjustment of the first engagement protrusion T1 and the first engagement protrusion T1 is subject to small hindrance from a structure that is in contact with the first engagement protrusion T1 when assembling the frame and thus the first engagement protrusion T1 can be easily engaged in the first engagement recess C1, reducing the difficulty of assembling the frame. Moreover, due to the small volume of the first engagement protrusion T1, the first engagement protrusion T1 can also be easily disengaged from the first engagement recess C1 when the frame is disassembled, thereby further reducing the difficulty of disassembling the frame.

In some examples of the present disclosure, the second engagement protrusion T2 may have a third surface A3 facing towards the second frame plate 1031 and a fourth surface A4 facing away from the second frame plate 1031. In some embodiments of the present disclosure, the surface of the back case plate 1021 facing away from the first frame plate 1011 may be the second reference surface, and the third surface A3 may be parallel to and in contact with the wall surface of the second engagement recess C2 facing away from the second reference surface. In some examples of the present disclosure, the fourth surface A4 may make an angle with and be spaced from the wall surface of the second engagement recess C2 facing towards the second reference surface. For example, the third surface A3 may be perpendicular to the second frame wall 1032, and the fourth surface A4 may extend towards the surface of the second engagement protrusion T2 facing away from the second frame wall 1032 and be inclined towards the second frame plate 1031; and the third surface A3 may be in contact with a wall surface of the second engagement recess C2 facing away from the second reference surface.

In some examples of the present disclosure, the first engagement recess C1 may be located on the first frame wall 1012, both the first engagement protrusion T1 and the second engagement recess C2 may be located on the back case wall 1022, and the second engagement protrusion T2 may be located on the housing wall 1032. In other examples of the present disclosure, the first engagement recess C1 may also be located on both the first frame wall 1012 and the first frame plate 1011, and the second engagement recess C2 may also be located on both the back case wall 1022 and the back case plate 1021, which are not limited in the embodiments of the present disclosure.

In the embodiments of the present disclosure, only an example is described in which the section of the first engagement recess C1 and the second engagement recess C2 is rectangular, and sizes of an opening and bottom surface of the engagement recess are the same, as shown in FIGS. 1, 3, and 4. In some examples of the present disclosure, the section may also have a shape of a trapezoid, such as a right-angled trapezoid. In this case, an area of the opening of the engagement recess may be larger than an area of the bottom surface of the engagement recess, which is not limited in the embodiments of the present disclosure.

Figure 5:
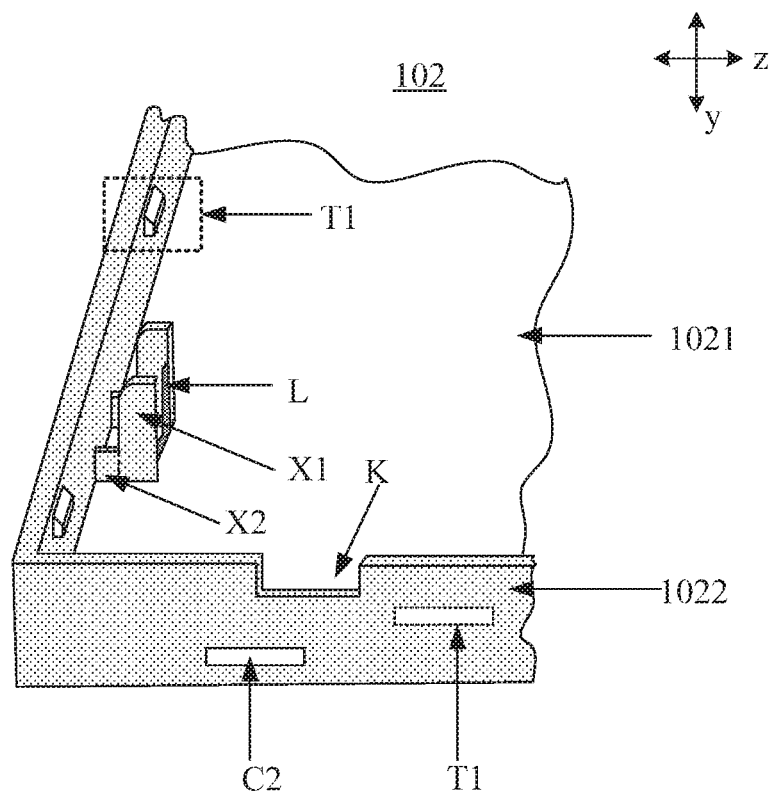
FIG. 5 is a schematic view showing a structure of a part of a back case according to embodiments of the present disclosure.

In some examples of the present disclosure, with continued reference to FIGS. 3 and 4, the back case 102 may further include: a position limit part X protruding from the edge region of the surface, facing towards the first frame plate 1011, of the back case plate 1021, the position limit part X may include a first position limit protrusion X1, and the first frame wall 1012 may be located between the back case wall 1022 and the first position limit protrusion X1. FIG. 5 shows a structure of a part of the back case including a position limit part. The first position limit protrusion X1 can cooperate with the first engagement protrusion and the first engagement recess to fix the relative position between the first frame and the back case, preventing movement of the first frame wall in the z direction and deformation of the first frame wall under the action of an external force.

Figure 6:
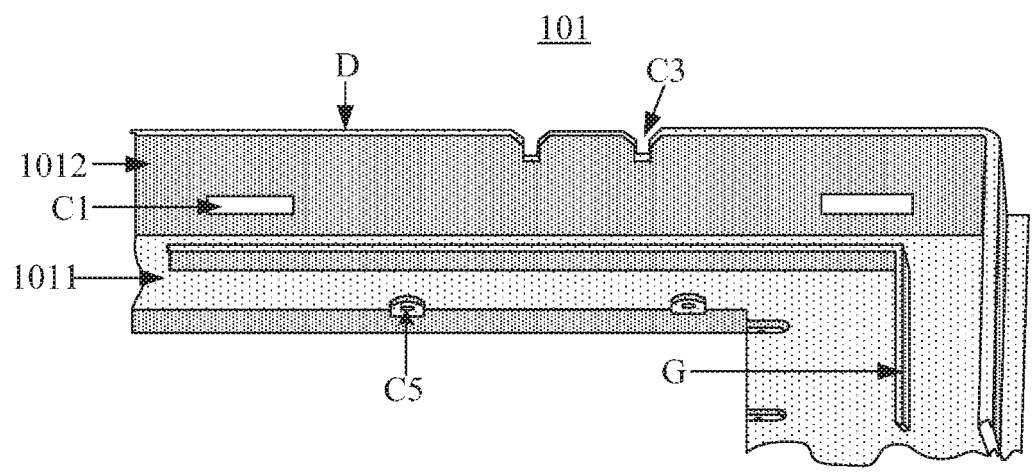
FIG. 6 is a schematic view showing a structure of a part of a first frame according to embodiments of the present disclosure.

With continued reference to FIG. 5, the position limit part X may further include: a second position limit protrusion X2 connected to the first position limit protrusion X1. FIG. 6 shows a structure of a part of the first frame. As shown in FIG. 6, an edge D of the first frame wall 1012 facing away from the first frame plate 1011 has a position limit recess C3 that is configured to match the second position limit protrusion X2. Referring to FIGS. 5 and 6, the second position limit protrusion X2 may be located in the position limit recess C3 to prevent the movement of the first frame wall in the y direction. In some examples of the present disclosure, edges of the position limit recess C3 may have a chamfer or a rounded corner, so that the second position limit protrusion X2 can easily engaged into the position limit recess C3.

In some examples of the present disclosure, the number of the position limit parts X in the back case 102 may be more than one, the plurality of position limit parts may be evenly distributed in the edge region of the back case plate 1021, and each position limit part may be located between two first engagement protrusions T1.

Figure 7:
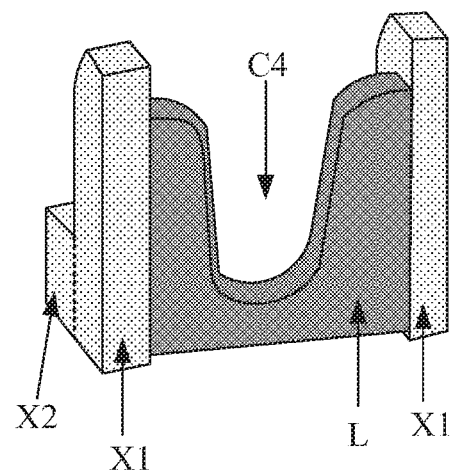
FIG. 7 is a schematic view showing a structure of a blocking part according to embodiments of the present disclosure.

FIG. 7 is a schematic view showing a structure of a position limit part. In some examples of the present disclosure, referring to FIGS. 5 and 7, each position limit part may include a plurality of the first position limit protrusions X1 and a plurality of the second position limit protrusions X2 (FIG. 5 and FIG. 7 are example in which two first position limit protrusions X1 and two second position limit protrusions X2 are included) and in the embodiment, each first position limit protrusion X1 may be connected to one corresponding second position limit protrusion X2, and the plurality of first position limit protrusions X1 may be connected through a connecting structure L to increase strength of the position limit part. A recess C4 may be provided in the connection structure L between two first position limit protrusions X1 of a single position limit part to increase flexibility of the position limit part. The recess may have a U shape, a polygonal shape, or a circular shape, or the like, which is not limited in the embodiments of the present disclosure. The edge of the first position limit protrusion X1, facing towards the back case wall 1022, at an end of the first position limit protrusion X1 facing away from the back case plate 1021 may have a chamfer or a rounded corner to reduce hindrance of the first frame wall by the position limit protrusion X1 when assembling the first frame and thus reduce the difficulty of assembling the frame.

In some examples of the present disclosure, with continued reference to FIG. 5, the edge of the back case wall 1022 facing away from the back case plate 1021 may also have a notch K. The notch K may be disposed close to any one of the plurality of first engagement protrusions on the back case wall, for more convenient disassembly of the frame. When the frame is disassembled, the back case wall can be pulled outward through the gap K on the back case, so that the first engagement protrusion close to the gap K is disengaged from the first engagement recess where the engagement protrusion is received. In this case, a gap will be generated between the back case wall and the first frame wall such that other first engagement protrusions can also be gradually disengaged from the corresponding first engagement recesses by the gap thereby realizing the disengagement of the back case and the first frame.

In some examples of the present disclosure, with continued reference to FIGS. 1, 3 and 4, the first frame wall 1012 and the back case wall 1022 may have the same height, so that the edge of the back case wall 1022 facing away from the back case plate 1021 may be in contact with the surface of the first frame plate 1011 facing towards the back case plate 1021, and the edge of the first frame wall 1012 facing away from the first frame plate 1011 may be in contact with the surface of the back case plate 1021 facing towards the first frame plate 1011. This design can be favor of fixation of positions of the first frame 101 and the back case 102 by the first engagement protrusion T1 and the first engagement recess C1 and avoid the first engagement protrusion T1, after being located in the first engagement recess C1, from continuously sliding out of the first engagement recess C1 in a direction away from the back case plate 1021 under the action of external force, so that the first frame 101 and the back case 102 are more securely engaged.

In some examples of the present disclosure, with continued reference to FIG. 1, FIG. 3 and FIG. 4, the edge of the first frame wall 1012, facing away from the first frame plate 1011 and facing towards the back case wall 1022, may have a chamfer or rounded corner. The edges of the back case wall 1022 facing away from the back case plate 1021 may have chamfers or rounded corners. Due to the rounded corners or chamfers, a thickness of the edge of the first frame wall 1012 facing away from the first frame plate 1011 is reduced, and a thickness of the edge of the back case wall 1022 facing away from the back case plate 1021 is also reduced. A structure contacting the chamfered or rounded corner can have reduced hindrance on the wall in which the chamfered or rounded corner is located during assembling of the frame, and thus the difficulty of assembling the frame can be further reduced. In some examples of the present disclosure, the edge of the second frame wall 1032 facing away from the second frame plate 1031 and facing towards the back case wall 1022 may also have a chamfer or rounded corner, which is not limited in the embodiments of the present disclosure.

In some examples of the present disclosure, with continued reference to FIG. 3, FIG. 4 and FIG. 6, the surface of the first frame plate 1011 facing towards the back case plate 1021 may have a reinforcement structure for enhancing strength of the first frame plate 1011 and thus in turn enhancing durability of the frame 10. In some embodiments of the present disclosure, the reinforcement structure may be composed of at least one reinforcement bar G, the reinforcement bar G may have a ring shape, the reinforcement bar G may surround the region surrounded by the first frame plate 1011; and when the reinforcement structure includes a plurality of reinforcement bars G, the plurality of reinforcement bars G may be disposed as outer reinforcement bars G surrounding inner reinforcement bars G. FIGS. 3 and 4 illustrate an example in which the reinforcement structure includes two reinforcement bars G and FIG. 6 illustrates an example in which the reinforcement structure includes only one reinforcement bar G. In some examples of the present disclosure, the reinforcement structure may also be composed of a plurality of reinforcement protrusions, the plurality of reinforcement protrusions may be arranged in a ring, and the plurality of reinforcement protrusions may also surround the region surrounded by the first frame plate 1011.

In some examples of the present disclosure, the surface of the back case plate 1021 facing towards the first frame plate 1011 may also be provided with a reinforcement structure, which may include a plurality of reinforcement bars arranged in an array, or may also include a plurality of reinforcement bars arranged in a grid. That is not limited in the embodiments of the present disclosure.

In some examples of the present disclosure, with continued reference to FIGS. 2, 3, and 4, the frame 10 may further include: a third frame 104. The third frame 104 may include a third frame plate 1041 and a third frame wall 1042. The third frame plate 1041 may be located on the side of the first frame plate 1011 facing away from the back case plate 1021, and the third frame wall 1042 may protrude from the surface of the third frame plate 1041 facing towards the first frame plate 1011.

Figure 8:
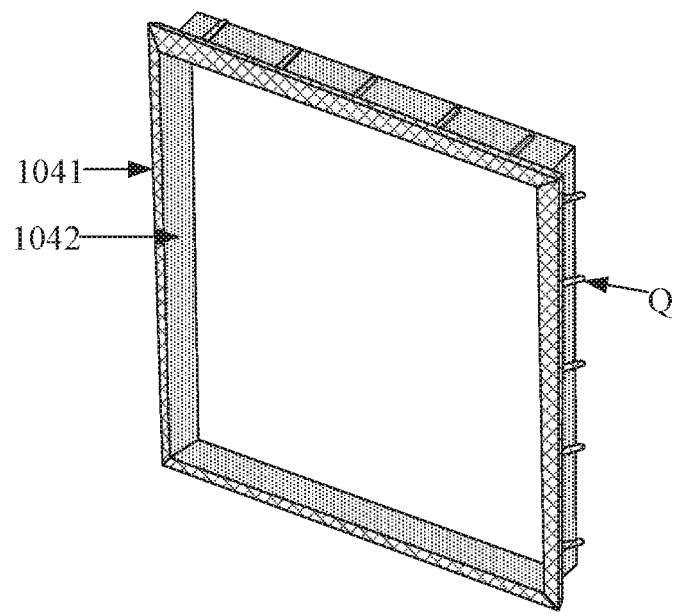
FIG. 8 is a schematic view showing a structure of a third frame according to embodiments of the present disclosure.
Figure 9:
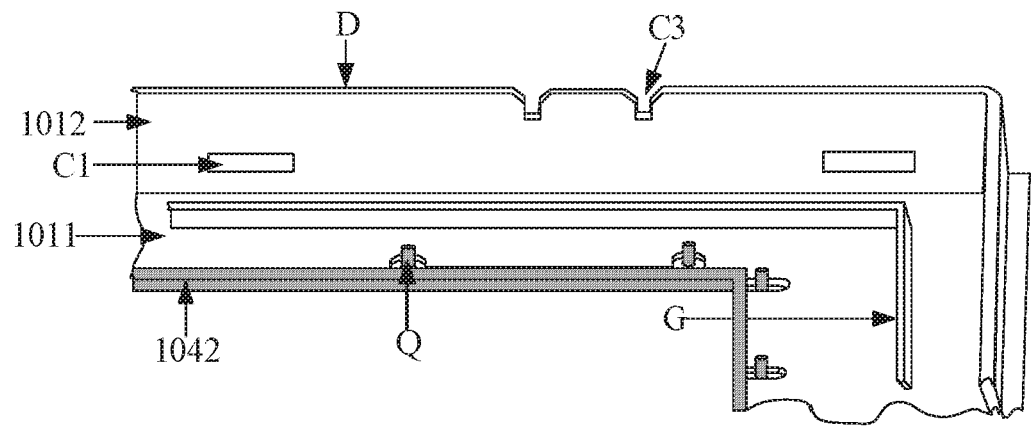
FIG. 9 is a schematic view showing a structure of a third frame and a first frame according to embodiments of the present disclosure.

FIG. 8 is a schematic structural view of the third frame. In some embodiments of the present disclosure, referring to FIG. 8, the third frame plate 1041 and the third frame wall 1042 may each have a ring shape, and the third frame wall 1042 may be located in an inner edge region of the third frame plate 1041, and the third frame wall 1042 may be fitted inside the first frame plate 1011. The surface of the third frame plate 1041 facing towards the first frame plate 1011 (that is, the surface of the third frame plate 1041 where the third frame skull 1042 is located) may have a plurality of fixing protrusions Q. Referring to FIG. 6, an edge region of the surface of the first frame plate 1011 facing away from the back case plate 1021 may have a plurality of fixing recesses C5, the plurality of fixing recesses may be in one-to-one correspondence with the plurality of fixing protrusions Q, and each fixing protrusion Q may be engaged in one corresponding fixing recess. Referring to FIG. 6, the fixing recess C5 in the first frame plate 1011 may be a through hole penetrating through the first frame plate 1011. In some examples of the present disclosure, the third frame wall may be connected to the first frame plate by hot melt or welding. For example, each fixing protrusion Q in the third frame plate may pass through one corresponding fixing recess C5 and protrude from the fixing recess C5 obtaining the structure as shown in FIG. 9. After that, the part of the fixing protrusion Q protruding from the fixing recess C5 may be heated to be melt into the corresponding fixing recess C5, thereby connecting the third frame and the first frame.

In some examples of the present disclosure, referring to FIGS. 1 to 4, the surface of the second frame plate 1031 facing away from the first frame plate 1011 and the surface of the third frame plate 1041 facing away from the first frame plate 1011 may be both inclined towards the first frame plate 1011; and a thickness of the inner edge of the second frame plate 1031 may be greater than a thickness of the outer edge of the third frame plate 1041, which can improve the sense of hierarchy and aesthetics of the frame.

In some examples of the present disclosure, with continued reference to FIG. 3 and FIG. 4, the frame 10 may further include: a decorative layer 105 located on the surface of the first frame plate 1011 facing away from the back case plate 1021 and configured to decorate the surface of the first frame plates 1011 facing away from the back case plate 1021 to increase the aesthetics of the frame. The decorative layer 105 may be located between the first frame plate 1011 and the third frame plate 1041, and between the first frame plate 1011 and the second frame plate 1031, and the decorative layer 105 may include an area, which is not shielded by the second frame plate 1031 and the third frame plate 1041, on a surface of the decorative layer 105 facing away from the first frame plate 1011, that is, only the edge region of the decorative layer 105 may be shielded. Since the edge of the decorative layer is generally more likely to have defects, shielding the edge region can avoid exposure of the defective region of the decorative layer, which can further increase the aesthetics of the frame.

In some examples of the present disclosure, the decorative layer 105 may also be located only on the region of the surface of the first frame plate 1011 facing away from the back case plate 1021, and the region of the surface is not shielded by the second frame plate 1031 and the third frame plate 1041. The decorative layer 105 may be attached to the surface of the first frame plate 1011 facing away from the back case plate 1021 by glue. The decorative layer 105 may also have a ring shape, or may be composed of a plurality of decorative sections arranged in the ring shape, which is not limited herein.

In some examples of the present disclosure, the decorative layer 105 may transmit light, and may have an acoustic insulation rate lower than a preset acoustic insulation rate, thereby reducing or avoiding influence of the decorative layer 105 on electronic devices between the first frame 101 and the back case 102. For example, the light transmittance and acoustic insulation rate of the decorative layer 105 may be set according to working needs of the electronic devices in the display panel provided between the first frame 101 and the back case 102.

In some embodiments of the present disclosure, the decorative layer 105 may be a cloth art decorative layer or a leather decorative layer, or the like. In this way, cloth art or leather may be combined with the electronic frame, so that the electronic frame can be in better coincidence with a style of home decoration and more beautiful.

In some examples of the present disclosure, the first frame wall, the first frame plate and the reinforcement structure thereon may be an integrated structure, the back case plate, the back case wall, the first engagement protrusion and the blocking part may also be integrated structure, the second frame plate, the second frame wall and the second engagement protrusion may also be an integrated structure, and the third frame plate, the third frame wall and the fixing protrusion may also be an integrated structure.

In some embodiments of the present disclosure, referring to FIGS. 1, 3, 10 and 11, the surface of the second frame plate 1031 facing towards the first frame plate 1011 has an annular edge facing away from the second frame wall 1032, and the second frame plate 1031 includes an annular strip-shaped protrusion 1033 protruding toward the first frame plate 1011 from the annular edge of the surface of the second frame plate 1031 facing towards the first frame plate 1011. According to the embodiments of the present disclosure, an annular groove 1035 is formed between the second frame wall 1032 and the annular strip-shaped protrusion 1033, thereby for example reducing a weight of the second frame 103 and increasing rigidity of the second frame 103.

In some embodiments of the present disclosure, referring to FIG. 1, FIG. 3, FIG. 10, and FIG. 11, the second frame plate 1031 includes a plurality of bosses 1036 provided between the second frame wall 1032 and the strip-shaped protrusions 1033 and on the surface of the second frame plate 1031 facing towards the first frame plate 1011. The plurality of bosses 1036 are arranged at intervals around the second frame wall 1032 along the second frame plate 1031. The strip-shaped protrusions 1033 each have a plane surface facing towards the first frame plate 1011, the bosses 1036 each have a plane surface facing towards the first frame plate 1011, and the plane surfaces of the strip-shaped protrusions 1033 and the bosses 1036 are coplanar. With the configuration, for example, the first frame plate 1011 can be stably supported.

In some embodiments of the present disclosure, referring to FIG. 1, the back case 102 has the second engagement recesses C2, the second frame 103 has the second engagement protrusions T2, and the second engagement protrusions T2 are respectively engaged in the second engagement recesses C2. The plurality of second engagement protrusions T2 are in one-to-one correspondence with the plurality of second engagement recesses C2, and each second engagement protrusion T2 is engaged in one corresponding second engagement recess C2. Referring to FIGS. 1, 3, 10 and 11, an orthographic projection of each of the plurality of second engagement protrusions T2 on the surface of the first frame plate 1011 partially overlaps an orthographic projection of a corresponding one of the plurality of bosses 1036 on the surface of the first frame plate 1011. Thus, for example, the second frame 103 can be more easily taken out of an injection mold.

In summary, at least two of the first frame, the back case and the second frame in the frame provided by the embodiments of the present disclosure are engaged with each other, such that part or all of the frame can be assembled or disassembled without tools, achieving a relative simple and easy assembly or disassembly process of the frame.

Embodiments of the present disclosure also provide an electronic frame. The electronic frame may include: a frame and a display panel mounted in the frame. The frame may be the frame 10 as shown in any one of FIGS. 1 to 4 and the display panel may be the display panel 20 shown in FIGS. 1 and 2.

Figure 10:
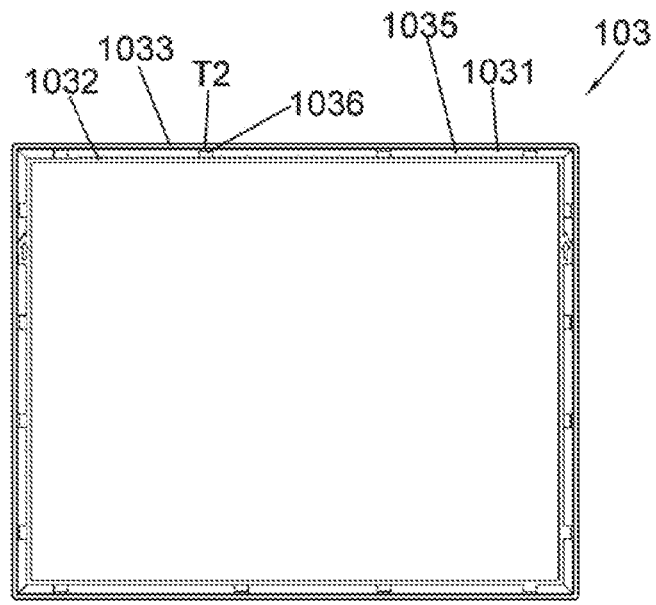
FIG. 10 is a schematic view showing a structure of a second frame according to embodiments of the present disclosure.
Figure 11:
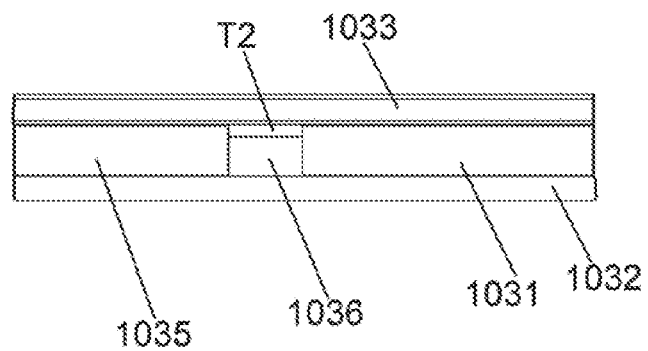
FIG. 11 is a partial enlarged view of the second frame as shown in FIG. 10.

In some embodiments of the present disclosure, referring to FIGS. 1, 8, and 10, the display panel 20 has a rectangular shape, the first frame 101 and the second frame 102 have a rectangular ring shape, and the back case 102 has a rectangular shape.

In some embodiments of the present disclosure, when assembling the electronic frame provided by the embodiments of the present disclosure, the decorative layer 105 may be first attached to the part of the surface of the first frame plate 1011 where the first frame wall 1012 is not provided, then, the fixing protrusions of the third frame 104 may be inserted into the fixing recesses, respectively, and the parts of the fixing protrusions protruding from the fixing recesses are melted so as to connect the third frame 104 with the first frame 101. Next, the display panel 20 and the devices or lines connected to the display panel 20 may be placed in the region surrounded by the first frame wall 1012, such that a display surface of the display panel 20 is in contact with the surface of the first frame plate 1011 where the first frame wall 1012 is provided. After that, the back case 102 may be engaged with the first frame 101, and finally the second frame 103 is fitted over the first frame 101 and the back case 102, such that the second frame plate 1031 of the second frame 103 is located on the side of the first frame plate 1011 facing away from the back case plate 1021 of the back case 102 and covers a part of the decorative layer 105 to obtain the electronic frame as shown in FIG. 2. When disassembling the electronic frame provided by the embodiment of the present disclosure, it is only necessary to disassemble in reverse order of the above assembly process, which will not be repeated herein.

In summary, at least two of the first frame, the back case and the second frame of the electronic frame provided by the embodiments of the present disclosure are engaged with each other, so that part or all of the frame of the electronic frame can be assembled or disassembled without a tool, realizing the relatively simple and easy assembly or disassembly process of the electronic frame.

The above are only optional embodiments of the embodiments of the present disclosure and are not intended to limit the present disclosure. Any modification, equivalent replacement, improvement, etc. made within the spirit and principles of the embodiments of the present disclosure shall be included in the protection scope of the embodiments of the present disclosure.

What is claimed is:

1. A frame comprising:
a first frame, a back case and a second frame,
wherein the first frame comprises: a first frame plate and a first frame wall,
wherein the back case comprises: a back case plate and a back case wall,
wherein the second frame comprises: a second frame plate and a second frame wall, and the second frame is configured to surround the first frame and the back case,
wherein the first frame plate is disposed opposite to the back case plate, and the second frame plate is located on a side of the first frame plate facing away from the back case plate,
wherein the first frame wall is protruded from a surface of the first frame plate facing towards the back case plate, the back case wall is protruded from a surface of the back case plate facing towards the first frame plate, and the second frame wall is protruded from a surface of the second frame plate facing towards the first frame plate,
wherein the back case further comprises a position limit part protruded from the surface of the back case plate facing towards the first frame plate, the position limit part comprises a first position limit protrusion, and the first frame wall is located between the back case wall and the first position limit protrusion, and
wherein the position limit part further comprises a second position limit protrusion connected with the first position limit protrusion, and
the first frame wall has a position limit recess located at an edge of the first frame wall facing away from the first frame plate and matching the second position limit protrusion, and the second position limit protrusion is located in the position limit recess.

2. The frame of claim 1, wherein:
the first frame wall is located between the first frame plate and the back case plate, the back case wall is located between the first frame plate and the back case plate, and the second frame wall is located on a side of the second frame plate facing towards the first frame plate.

3. The frame of claim 1, wherein:
one of the first frame and the back case has a first engagement protrusion, and the other of the first frame and the back case has a first engagement recess, and the first engagement protrusion is engaged in the first engagement recess.

4. The frame of claim 3, wherein:
the back case has a plurality of first engagement protrusions, the first frame has a plurality of first engagement recesses in one-to-one correspondence with the plurality of first engagement protrusions, and each of the plurality of first engagement protrusions is engaged in a corresponding one of the plurality of first engagement recesses.

5. The frame of claim 3, wherein:
a first surface of the first engagement protrusion facing towards the back case plate is parallel to and in contact with a wall surface of the first engagement recess facing away from a first reference surface, and the first reference surface is a surface of the first frame plate facing away from the back case plate.

6. The frame of claim 3, wherein:
the back case wall has a notch at an edge of the back case wall facing away from the back case plate, and the notch is adjacent to the first engagement protrusion or the first engagement recess of the back case wall to disengage the first engagement protrusion from the first engagement recess.

7. The frame of claim 1, wherein:
one of the back case and the second frame has a second engagement protrusion, and the other of the back case and the second frame has a second engagement recess, and the second engagement protrusion is engaged in the second engagement recess.

8. The frame of claim 7, wherein:
the back case has a plurality of second engagement recesses, the second frame has a plurality of second engagement protrusions in one-to-one correspondence with the plurality of second engagement recesses, and each of the plurality of second engagement protrusions is engaged in a corresponding one of the plurality of second engagement recesses.

9. The frame of claim 7, wherein:
a third surface of the second engagement protrusion facing towards the second frame plate is parallel to and in contact with a wall surface of the second engagement recess facing away from a second reference surface, and the second reference surface is a surface of the back case plate facing away from the first frame plate.

10. The frame of claim 1, wherein:
the back case further comprises: a position limit part protruded from the surface of the back case plate facing towards the first frame plate,
the position limit part comprises:
a plurality of first position limit protrusions, wherein the first frame wall is located between the back case wall and the plurality of first position limit protrusions;
a plurality of second position limit protrusions respectively connected with the plurality of first position limit protrusions, wherein the first frame wall has a plurality of position limit recesses located at an edge of the first frame wall facing away from the first frame plate and matching the plurality of second position limit protrusions, and the plurality of second position limit protrusions are located in the plurality of position limit recesses, respectively; and
connection structures each connecting two adjacent ones of the plurality of first position limit protrusions, and each having a recess.

11. The frame of claim 1, wherein:
an edge of the back case wall facing away from the back case plate is in contact with the first frame plate, and/or
an edge of the first frame wall facing away from the first frame plate is in contact with the back case plate.

12. The frame of claim 1, wherein:
the back case wall is located between the first frame wall and the second frame wall.

13. The frame of claim 1, further comprising:
a third frame comprising: a third frame plate and a third frame wall,
wherein the third frame plate is located on a side of the first frame plate facing away from the back case plate, and the third frame wall is protruded from a surface of the third frame plate facing towards the first frame plate.

14. The frame of claim 13, wherein:
the third frame plate has a plurality of fixing protrusions on a surface of the third frame plate facing towards the first frame plate, the first frame plate has a plurality of fixing recesses in one-to-one correspondence with the plurality of fixing protrusions on a surface of the first frame plate facing towards the third frame plate, and each of the plurality of fixing protrusions is engaged in a corresponding one of the plurality of fixing recesses.

15. The frame of claim 1, wherein:
the surface of the second frame plate facing towards the first frame plate has an annular edge facing away from the second frame wall, and the second frame plate comprises an annular strip-shaped protrusion protruded from the annular edge towards the first frame plate.

16. The frame of claim 15, wherein:
the second frame plate further comprises a plurality of bosses on the surface of the second frame plate facing towards the first frame plate and between the second frame wall and the annular strip-shaped protrusion, the plurality of bosses are arranged at intervals along the second frame plate around the second frame wall, the annular strip-shaped protrusion has a plane facing towards the first frame plate, each of the plurality of bosses has a plane facing towards the first frame plate, and the plane of the annular strip-shaped protrusion is coplanar with the planes of the plurality of bosses.

17. The frame of claim 16, wherein:
the back case has a plurality of second engagement recesses, the second frame has a plurality of second engagement protrusions in one-to-one correspondence with the plurality of second engagement recesses, and each of the plurality of second engagement protrusions is engaged in a corresponding one of the plurality of second engagement recesses, and an orthogonal projection of each of the plurality of second engagement protrusions on the surface of the first frame plate partially overlaps an orthogonal projection of a corresponding one of the plurality of bosses on the surface of the first frame plate.

18. An electronic frame comprising:
a frame, and a display panel,
wherein the frame is the frame of claim 1, and the display panel is located between the first frame plate and the back case plate of the frame.

* * * * *